United States Patent [19]
Wheaton et al.

[11] Patent Number: 5,623,985
[45] Date of Patent: Apr. 29, 1997

[54] APPARATUS AND METHOD FOR MOLDING AN ARTICLE

[75] Inventors: Harold L. Wheaton, Bowerston; Lawrence D. Graham, Chagrin Falls, both of Ohio

[73] Assignee: PCC Airfoils, Inc., Cleveland, Ohio

[21] Appl. No.: 614,533

[22] Filed: Mar. 13, 1996

[51] Int. Cl.$^6$ .............................. B22D 27/04; B22C 9/04
[52] U.S. Cl. ...................... 164/516; 164/122.1; 164/361
[58] Field of Search ................................. 164/34, 35, 516, 164/122.1, 122.2, 361, 411, 366, 367

[56] References Cited

U.S. PATENT DOCUMENTS 4,596,281  6/1986  Bishop .................................. 164/122.1
5,295,530  3/1994  O'Connor et al.

Primary Examiner—Kuang Y. Lin
Attorney, Agent, or Firm—Tarolli, Sundheim, Covell, Tummino & Szabo

[57] ABSTRACT

An apparatus and method for use in casting a metal article includes a mold structure having wall sections with pins extending between the wall sections. The pins have opposite end portions which are embedded in the wall sections of the mold structure to interlock the pins and the wall sections of the mold structure. When molten metal is poured into the mold structure, the molten metal urges the wall sections away from each other. The wall sections are retained against movement relative to each other by the pins. Although the apparatus and method of the present invention can be utilized to cast many different types of articles, the invention is advantageously utilized in the casting of thin metal articles and specifically a thin metal article which is formed as a single crystal.

23 Claims, 5 Drawing Sheets

APPARATUS AND METHOD FOR MOLDING AN ARTICLE

BACKGROUND OF THE INVENTION

The present invention relates to a new and improved method and apparatus for use in casting a metal article and more specifically to a method and apparatus which may be used in casting of a thin metal article.

When a thin metal article is to be cast, a thin mold cavity is formed to shape molten metal to the desired configuration of the article. When molten metal is poured into the mold cavity, opposite side walls of the mold tend to bulge or creep under the influence of the force applied against the inner side surfaces of the mold by the molten metal. Various attempts to solve this problem have been made but with only marginal improvement. The attempts to solve the problem have included extra ceramic dips for a shell forming the mold, ceramic reinforcement rods on the mold, wrapping the mold with ceramic fiber, and running what has been referred to as a hot process only near the growth interface in the mold.

SUMMARY OF THE INVENTION

The present invention provides a new improved method and apparatus for use in casting a metal article. The apparatus includes a mold structure having one or more pins which extend between wall sections of the mold structure. A first end portion of a pin is disposed in the first wall section of the mold structure and a second end portion of the pin is disposed in a second wall section of the mold structure. A third or connector portion of the pin is disposed in the mold cavity. The end portions of the pin and the wall sections of the mold structure are interlocked to prevent relative movement between the wall sections.

To interlock the end portions of a pin and a wall section of the mold structure, in some embodiments of the invention the pin has a surface which faces toward the mold cavity and transmits force to the wall section of the mold structure. The end portion of the pin may have an outwardly flaring head end section, a circular groove, and/or a roughened portion which provides an interlock with the ceramic material of the wall section of the mold.

In another embodiment of the invention, the pins have central axes which are disposed in different orientations relative to a wall section of the mold. These pins apply forces in different directions relative to the mold structure.

Although the method and apparatus of the present invention may be utilized to cast may different types of objects, it is believed that the method and apparatus will be particularly advantageous in casting relatively long, and/or wide metal objects which are very thin. Thus, the method and apparatus may be used to cast a metal object having a thickness of 0.050 or less and a length and width of four inches or more. Although the thin metal article could be formed of many different metals having any one of many different crystallographic structures, the method and apparatus may advantageously be used to form a single crystal metal article, such as a plate or airfoil.

BRIEF DESCRIPTION OF THE DRAWINGS

The foregoing and other features of the invention will become more apparent upon a consideration of the following description taken in connection with the accompanying drawings, wherein.

DESCRIPTION OF SPECIFIC PREFERRED EMBODIMENTS OF THE INVENTION

Cast Metal Article

Figure 1:
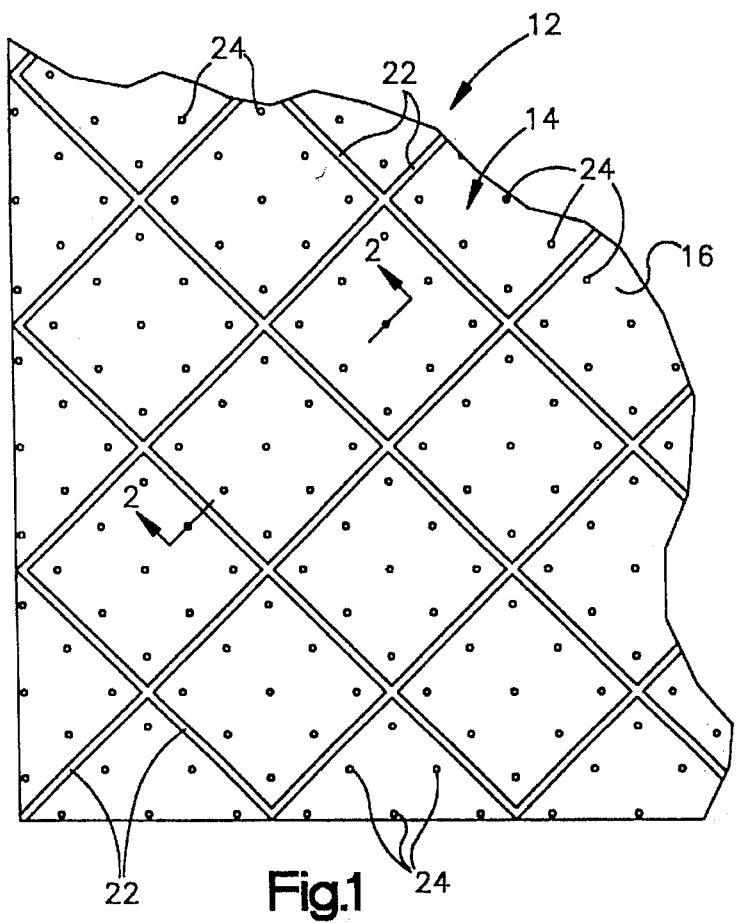
FIG. 1 is a fragmentary illustration of a thin plate formed as a single crystal of metal.
Figure 2:
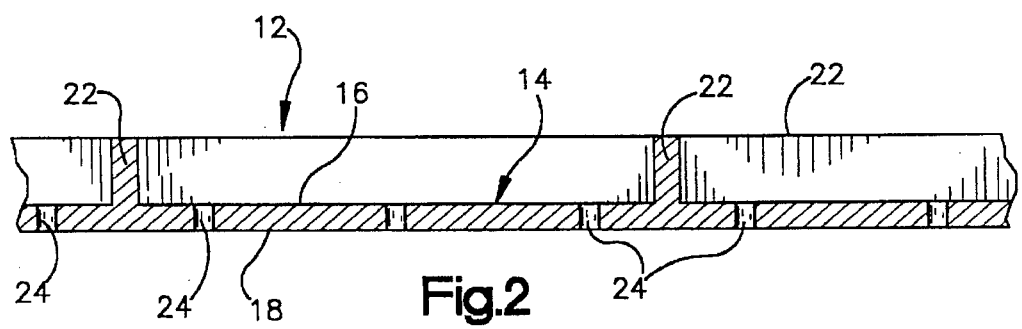
FIG. 2 is a sectional view, taken generally along the line 2—2 of FIG. 1, further illustrating the construction of the plate.

A thin metal panel 12 (FIG. 1) is formed as a single crystal of metal using the method and apparatus of the present invention. The thin metal panel 12 includes a thin flat main section 14. The thin main section 14 has flat parallel side surfaces 16 and 18 (FIG. 2). A rectangular array of linear ribs 22 extend from the side surface 16 of the main section 14 of the panel 12. The ribs 22 reinforce the main section 14 of the metal panel. If desired, the ribs 22 could be omitted.

A plurality of relatively small holes or openings 24 (FIGS. 1 and 2) are formed in the main section 14 of the panel 12. Although there are nine openings 24 in each rectangular cell or section of the array of ribs 22, a greater or lesser number of openings could be provided if desired.

The main section 14 of the panel 12 is relatively thin. Thus, the main section 14 of the panel 12 has a thickness, that is, the distance between the side surfaces 16 and 18 of FIG. 2, of 0.050 inches or less. In one specific embodiment of the panel 12, the main section 14 of the panel had a thickness of 0.015 inches. In this specific embodiment of the panel 12, the ribs 22 had a thickness of 0.020 inches and a height, that is, the distance from the side surface 16 (FIG. 2) of the rib to the outer edge of the rib, of 0.060 inches.

In this specific embodiment of the panel 12, the thin metal panel was formed as a single crystal of metal. Specifically, the thin metal panel 12 was cast as a single crystal of a nickel-chrome superalloy metal. However, it should be understood that the thin metal panel 12 could be formed with a different crystallographic structure and/or of a different material if desired. For example, it is contemplated that the thin metal panel 12 could have a columnar grained or equiaxed crystallographic structure. The metal panel 12 could be formed of a metal other than a nickel-chrome superalloy, for instance, the metal could be titanium or a titanium alloy.

The thin metal panel 12 is relatively long and wide. Thus, the main section 14 of the panel has a length of more than four inches and a width of more than four inches. In the illustrated embodiment of the panel 12, the thin metal panel has a width of approximately five inches and a height of approximately seven inches. However, it is contemplated that the thin metal panel 12 could be formed with many different dimensions. For example, the thin metal panel 12 could have a square configuration with a height and width of approximately four inches. Although the thin metal panel 12 has been illustrated in FIG. 1 as being the entire metal article, the thin metal panel could form a portion of a larger cast article.

It should be understood that the method and apparatus of the present invention may be used in the formation of articles other than thin metal panels. For example, the cast metal article could be a thin metal airfoil having the same general construction disclosed in U.S. Pat. No. 4,905,752 issued Mar. 6, 1990 and entitled "Method of Casting a Metal Article". Alternatively, the metal article could be a turbine engine component having a construction similar to the construction illustrated in U.S. Pat. No. 4,724,891 issued Feb. 16, 1988 and entitled "Thin Wall Casting". It is contemplated that the thin metal panel 12 could be an interior wall of an airfoil which is cast as one piece.

The method and/or apparatus of the present invention are advantageously utilized to cast large thin metal articles. As used herein, a large thin metal article is a metal article having a height and a width of more than four inches and a thickness of 0.050 inches or less. However, the method and/or apparatus of the present invention may be used to cast articles of any desired size, including large thick articles or hollow articles.

Mold Structure

A mold structure 32 (FIG. 3), constructed in accordance with the present invention, is used to cast the thin metal panel 12 as a single crystal. The mold structure 32 includes an article mold 34 having an article mold cavity 36 in which the thin metal panel 12 is cast as a single crystal of metal. The article mold cavity 36 has a configuration which corresponds to the configuration of the thin metal panel 12. Of course, if a different article was to be cast, such as an airfoil, the article mold cavity 36 would have a configuration corresponding to the configuration of the article to be cast.

A pour cup 40 is connected with the upper portion of the article mold 34 and is connected in fluid communication with the article mold cavity 36. A single crystal selector 42 extends downward from the article mold 34 to a starter 44. The starter 44 is disposed on a chill plate 46. The construction of the single crystal selector 42 and starter 44 is the same as disclosed in U.S. Pat. No. 4,940,073 issued Jul. 10, 1990 and entitled "Mold For Casting a Single Crystal Metal Article". However, single crystal selectors and starters having a different construction could be used if desired.

When the thin metal panel 12 is to be cast in the article mold cavity 36 of the mold structure 32, molten metal is poured into the pour cup 40. The molten metal flows from the pour cup 40 through the article mold cavity 36 and single crystal selector 42 into the starter 44. The molten metal solidifies in the starter 44 as a plurality of elongated grains or crystals which extend upward from the chill plate 46 to the upper end of the starter. A few of the grains of metal grow from the starter 44 into the single crystal selector 42.

As the few grains which enter the single crystal selector 42 continue to grow, the most favorably oriented grain or crystal grows at a greater rate than the other grains or crystals. Therefore, the most favorably oriented grain or crystal crowds out the less favorably oriented grains. This results in the single grain or crystal which is most favorably oriented growing from the crystal selector 42 into the article mold cavity 36.

The single grain or crystal which emerges from the crystal selector 42 into the article mold cavity 36 solidifies to completely fill the article mold cavity. The single crystal of metal which solidifies in the article mold cavity 36 has a configuration which corresponds to the desired configuration of the article to be cast. Thus, in the illustrated embodiment of the invention, the single crystal of metal solidifies with the desired configuration for the thin metal panel 12. The molten metal in the pour cup 40 then solidifies. During solidification of the molten metal in the pour cup 40, additional crystals may nucleate.

It should be understood that mold structures constructed in accordance with the present invention may be used to cast articles having many different crystallographic structures. When the article to be cast does not have a single crystal type crystallographic structure, the crystal selector 42 and starter 44 would not be included in the mold structure.

Figure 3:
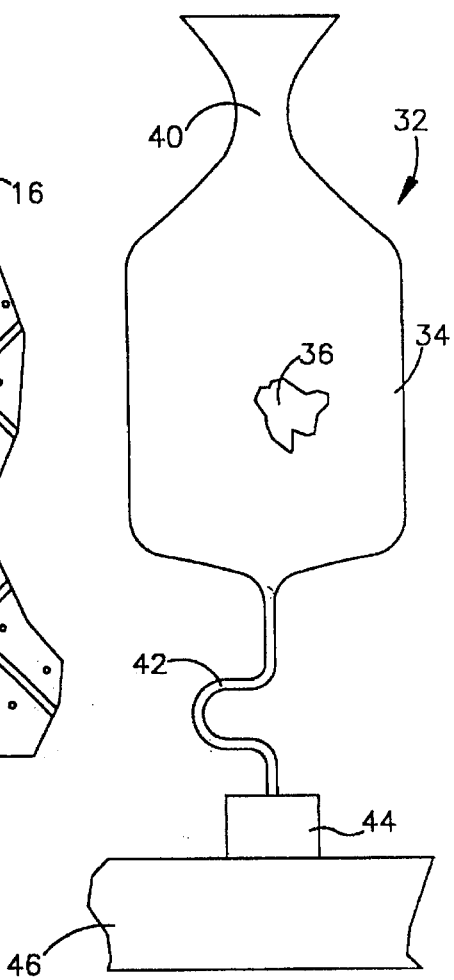
FIG. 3 is a schematic illustration of a ceramic mold structure used to cast the thin metal plate of FIGS. 1 and 2.

The mold structure 32 illustrated schematically in FIG. 3, has a relatively simple construction. It is contemplated that the mold structure 32 could, and probably will, have a more complex construction than the construction illustrated in FIG. 3. For example, the mold structure 32 could include a plurality of core sections enclosed by outer wall sections. If desired, the mold structure 32 could include gating which interconnects a plurality of article mold cavities.

Retainer Pins

Figure 4:
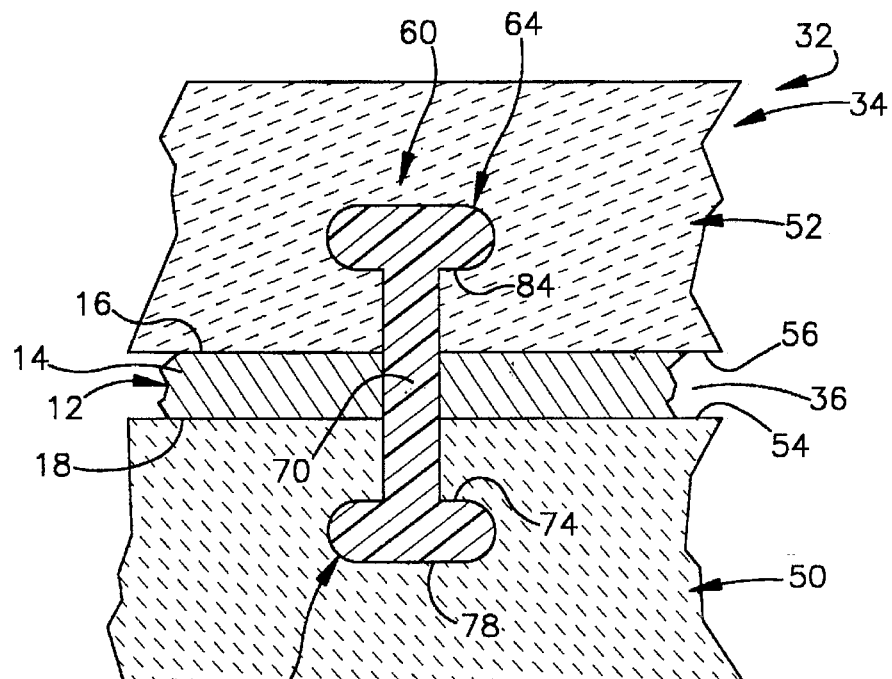
FIG. 4 is an enlarged fragmentary illustration of the relationship between a pin and wall sections of the mold structure of FIG. 3.

The article mold portion 34 of the mold structure 32 includes a pair of parallel wall sections 50 and 52 (FIG. 4). The article mold cavity 36 in which the thin metal panel 12 is cast, is disposed between the wall sections 50 and 52. When the molten metal flows from the pour cup 40 into the article mold cavity 36, fluid pressure is applied against opposite side surfaces 54 and 56 of the wall sections 50 and 52.

The fluid pressure applied against the wall sections 50 and 52 by the molten metal tends to cause the wall sections to creep or bulge. Thus, the wall sections 50 and 52 tend to move away from each other thereby increasing the distance between the side surfaces 54 and 56 and the thickness of the main section 14 of the thin metal panel 12. Since the main section 14 of the thin metal panel 12 is relatively thin, that is, 0.050 inches or less, even a small amount of deflection of the wall sections 50 and 52 can result in a substantial percentage increase in the thickness of the main section of the thin metal panel.

In accordance with one of the features of the present invention, retainer pins 60 are provided to retain the mold wall sections 50 and 52 against movement relative to each other. Although only a single retainer pin 60 is illustrated in FIG. 4, it should be understood that a substantial number of retainer pins may be used. Thus, each of the openings 24 (FIGS. 1 and 2) in the thin metal panel 12 is formed by a retainer pin 60. In the specific embodiment of the thin metal panel 12 illustrated in FIGS. 1 and 2, more than three hundred retainer pins 60 were used.

To retain the mold wall sections 50 and 52 (FIG. 4) against movement relative to each other, each of the retainer pins 60 has end portions 62 and 64 which are mechanically interlocked with the wall sections. This enables each retainer pin 60 to transmit force between the wall sections 50 and 52 to hold the wall sections against movement relative to each other. By retaining the wall sections 50 and 52 against movement relative to each other, the thin main section 14 of the metal panel 12 is accurately formed with the desired thickness. Although the retainer pins 60 have been illustrated in FIG. 4 as extending between outer mold wall sections 50 and 52 of the mold structure 32, the retainer pins could extend between inner mold wall sections or between an inner mold wall section and an outer mold wall section of a more complicated mold structure.

In the embodiment of the retainer pin 60 illustrated in FIG. 4, the retainer pin has end portions 62 and 64 which project outward from a cylindrical connector portion 70 of the retainer pin. The end portions 62 and 64 of the retainer pin 60 have a circular cross sectional configuration, as viewed in a plane perpendicular to a central axis of the retainer pin. The centers of the end portions 62 and 64 of the retainer pin 60 are disposed on a longitudinal central axis of the connector portion 70.

In this embodiment of the invention, a plurality of evenly spaced retainer pins 60 have connector portions 70 with parallel central axes are used to retain the wall sections 50 and 52 against movement relative to each other. However, if desired, the connector portions 70 of at least some of the retainer pins 60 could have central axes which extend transverse to central axes of other retainer pins. It is contemplated that the number of retainer pins 60 which are used and/or the spacing between retainer pins may vary depending upon the article to be cast.

The end portion 62 of the retainer pin 60 (FIG. 5) has a flat annular side surface 74 which faces toward the article mold cavity 36. The flat annular side surface 74 has a center which is disposed on a longitudinal central axis of the connector portion 70. The flat annular side surface 74 engages the ceramic mold material forming the wall section 50 of the article mold 34.

In addition to the flat annular side surface 74, the end portion 62 of the retainer pin 60 has a flat circular end surface 78 which extends parallel to the flat annular side surface 74 and faces away from the article mold cavity 36. The parallel surfaces 74 and 78 on the end portion 62 of the retainer pin 60 are interconnected by an arcuate side surface 80 having a semicircular cross sectional configuration.

The end portion 64 (FIG. 4) of the retainer pin 60 has the same construction as the end portion 62 of the retainer pin. Thus, the end portion 64 of the retainer pin 60 has a flat annular side surface 84 which faces toward the mold cavity 36 and is parallel to the flat annular side surface 74 on the end portion 62. The flat annular side surface 84 on the end portion 64 of the retainer pin 60 is disposed in engagement with the ceramic mold material forming the wall section 52.

In the embodiment of the invention illustrated in FIG. 4, the retainer pins 60 have parallel central axes. Therefore, the flat side surfaces 74 and 84 on the end portions 62 and 64 of the retainer pins 60 extend parallel to each other. However, it is contemplated that the orientations of at least some of the retainer pins 60 could be different than other retainer pins so that some side surfaces 74 and 84 are skewed relative to other side surfaces.

When the molten metal which is to form the thin metal panel 12 is poured into the mold cavity 36, the fluid pressure against the side surfaces 54 and 56 of the wall sections 50 and 52 urge the wall sections away from each other. The end portions 62 and 64 (FIG. 4) of the retainer pin 60 transmit equal and oppositely directed reaction forces to the connector portion 70 of the retainer pin 60. The connector portion 70 is capable of withstanding these reaction forces to hold the wall sections 50 and 52 of the article mold 34 against movement relative to each other.

Since the end portions 62 and 64 of the retainer pin 60 bulge or project outward from the connector portion 70 of the retainer pin, there is a mechanical interlock between the end portions 62 and 64 of the retainer pin and the wall sections 50 and 52 of the article mold 34. This mechanical interlock prevents the end portion 62 of the retainer pin 60 from moving relative to the wall section 50. Similarly, the mechanical interlock prevents the end portion 64 of the retainer pin 60 from moving relative to the wall section 52.

Figure 5:
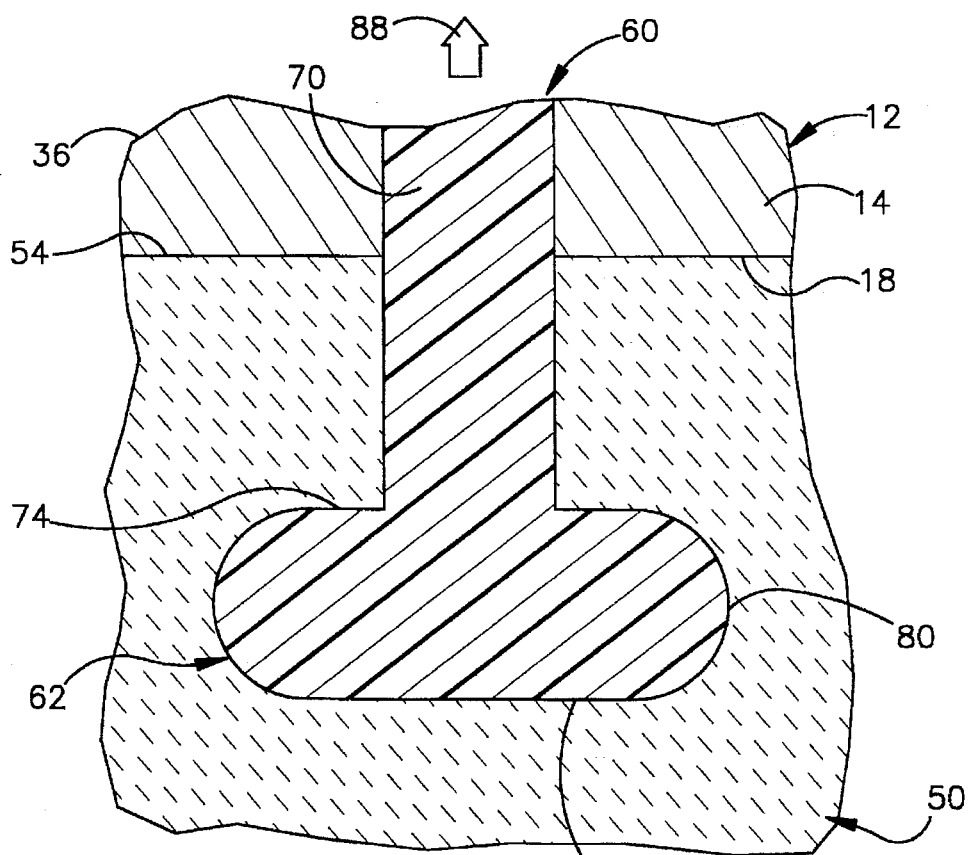
FIG. 5 is a further enlarged fragmentary sectional view of a portion of the pin of FIG. 4 and illustrating the relationship between one end portion of the pin and one of the wall sections of the mold structure.

In the embodiment of the invention illustrated in FIGS. 4 and 5, the mechanical interlock between the end portions 62 and 64 of the retainer pin 60 and the wall sections 50 and 52 is provided by the flat annular side surfaces 74 and 84 which engage the ceramic mold material of the wall sections. Thus, when molten metal is poured into the article mold cavity 36, the fluid pressure force exerted by the molten metal against the side surface 54 of the mold wall section 50 presses the ceramic mold material of the mold wall section against the flat annular side surface 74 on the end portion 62 of the retainer pin 60. The force of the molten metal against the side surface 54 of the wall section 50 of the mold structure 32 urges the flat annular side surface 74 of the retainer pin 60 downward (as viewed in FIGS. 4 and 5), that is, away from the mold wall section 52. This results in a reaction force, indicated by the arrow 88 in FIG. 5, being transmitted to the connector portion 70 of the retainer pin 60.

When molten metal is poured into the article mold cavity 36, the fluid pressure force against the side surface 56 (FIG. 4) on the mold wall section 52 urges the mold wall section 52 away from the mold wall section 50. The ceramic mold material of the mold wall section 52 is pressed against the flat annular side surface 84 on the end portion 64 of the retainer pin 60. This results in a downward (as viewed in FIG. 4) reaction force being transmitted to the connector portion 70 of the retainer pin 60.

The downward (as viewed in FIG. 4) reaction force transmitted from the end portion 64 of the retainer pin 60 to the connector portion 70 of the retainer pin is equal to and oppositely directed from the reaction force 88 transmitted from the end portion 62 of the retainer pin to the connector portion 70 of the retainer pin. The connector portion 70 of the retainer pin 60 is more than strong enough to withstand the reaction forces. Therefore, the end portions 62 and 64 of the retainer pin 60 do not move relative to each other and the wall sections 50 and 52 are held against movement relative to each other.

In one specific embodiment of the retainer pin 60, the retainer pin was formed of alumina ($Al_2O_3$). However, the retainer pin 60 could be formed of quartz or a similar material if desired. The end portions 62 and 64 and connector portion 70 of the retainer pin 60 are sized to have sufficient strength at high temperatures to withstand the forces applied to the wall sections 50 and 52 by the molten metal in the article mold cavity 36.

The specific retainer pins 60 used in the mold structure 32 to cast the thin metal plate 12 each had a cylindrical connector portion 70 of with a diameter of approximately 0.020 inches and a length of approximately 0.14 inches. The end portions 62 and 64 of this specific retainer pin 60 had a diameter which was approximately 1.5 times the diameter of the connector portion 70 of the retainer pin. The foregoing specific embodiment of the retainer pin 60 was utilized with a mold structure 32 having a mold cavity 36 with a thickness of 0.016 to 0.017 inches.

It should be understood that the foregoing specific dimensions for an alumina ($Al_2O_3$) retainer pin 60 have been set forth herein for purposes of clarity of description and not for purposes of limitation of the invention. It should be understood that the retainer pin 60 may be formed of different materials and with different dimensions if desired. For example, the end portions 60 and 62 of the retainer pin 60 may have a diameter of 2.0 or more times the diameter of the connector portion 70.

The retainer pin 60 illustrated in FIG. 4 has end portions 62 and 64 with one particular configuration. It is contemplated that it may be preferred to form the end portions 62 and 64 with a different configuration. For example, the end portions 62 and 64 could be formed by upsetting opposite ends of a heated pin to form bulges having freely formed outer side surfaces corresponding to the surfaces 74 and 84. If this was done, at least portions of the surfaces corresponding to the surfaces 74 and 84 would slope at an acute angle to a central axis of the connector portion 70.

The retainer pin 60 illustrated in FIG. 4 is integrally formed as one-piece. However, it is contemplated that the retainer pin 60 could be formed as two or more pieces which are subsequently interconnected. For example, the end portion 62 of the retainer pin 60 could be formed separately from the connector portion 70 and connected with the connector portion after the connector portion has been inserted through a wax pattern.

The retainer pin 60 has a longitudinal central axis which extends through opposite end portions 62 and 64 of the pin and extends perpendicular to the side surfaces 54 and 56 of the wall sections 50 and 52. The central axis of the pin 60 could be skewed at an acute angle to the side surfaces 54 and 56 of the wall sections 50 and 52. Adjacent retainer pins 60 could be positioned in different orientations relative to the side surfaces 54 and 56 of the wall sections 50 and 52 if desired.

Mold To Cast Metal Article

When the mold structure 32 is to be fabricated, a wax pattern (not shown) is formed. The wax pattern of the mold structure includes an article pattern section having a configuration corresponding to the configuration of the article to be cast, that is, the thin metal panel 12. The wax pattern of the article to be cast may be injection molded of either a natural wax or an artificial substance having characteristics which are generally similar to natural waxes. If desired, the pattern could be a thermoformed or machined polymeric material. It is also contemplated that the pattern may be reaction injection molded.

Since the main section 14 (FIGS. 1 and 2) of the thin metal panel 12 has a thickness of less than 0.050 inches, the wax pattern of the main section 14 of the panel 12 will have a thickness of less than 0.050 inches. In the specific embodiment of the thin metal panel 12 previously referred to, the main section 14 had a thickness of 0.015 inches, a width of approximately 5 inches and a height of approximately 7 inches. The ribs 22 had a thickness of approximately 0.020 inches, a height as measured upward, as viewed in FIG. 2, from the side surface 16 of approximately 0.060 inches. The array of ribs formed rectangles having an area of approximately one square inch. The wax pattern for the thin metal panel 12 was formed to correspond to these dimensions.

The retainer pins 60 are inserted through the wax pattern of the thin metal panel 12. In the previously mentioned specific embodiment of the pattern for the thin metal panel 12, there were nine pins for each of the one inch square areas formed by the ribs 22. Since the head end portions 62 and 64 of the retainer pins 60 have a cross sectional area which is greater than the cross sectional area of the connector portion 70 of the retainer pins, holes were formed in the main section of the panel pattern having a diameter corresponding to the diameter of the end portions 62 and 64 of the retainer pins. The holes were located at equally spaced intervals in each of the rectangles formed by the ribs of the pattern of the thin metal panel 12.

The retainer pins 60 were inserted through the holes or openings in the main section of the wax pattern. The holes were then sealed around the connector portions 70 of the retainer pins. This resulted in the fabrication of a wax pattern of the thin metal panel 12 with retainer pins extending through the pattern. The end portions 62 of the retainer pins project from one side of the wax pattern and the end portions 64 of the retainer pins 60 project from the other side of the pattern.

In the illustrated embodiment of the invention, the retainer pins 60 are all positioned with their central axes extending perpendicular to flat outer side surfaces of the wax pattern. However, the retainer pins could be oriented with their central axes skewed at acute angles to flat outer side surfaces of the pattern. The retainer pins 60 could be positioned with their central axes in different orientations relative to the flat outer side surfaces of the wax pattern.

Once the pattern of the article to be cast, that is, the thin metal panel 12, has been formed with the retainer pins 60 projecting from opposite sides of the pattern, a wax pattern of the pour cup 40 is connected to the article pattern. In addition, a wax pattern of the single crystal selector 62 and starter 44 is connected to the wax pattern of the article. The resulting pattern assembly has a configuration which corresponds to and is smaller than the configuration of the mold structure 32.

Once the pattern assembly has been fabricated, it is covered with a suitable mold material. Thus, the entire pattern assembly, including the exposed end portions of the retainer pins 60, is completely covered with a liquid ceramic mold material. The entire pattern assembly may be covered with the liquid ceramic mold material by repetitively dipping the pattern assembly in a slurry of liquid ceramic mold material.

Although many different types of the slurries of the ceramic mold material could be utilized, one illustrative slurry contains fused silica, zircon, and other refractory materials in combination with binders. Chemical binders such as ethylsilicate, sodium silicate and colloidal silica can be utilized. In addition, the slurry may contain suitable film formers such as alginates, to control viscosity and wetting agents to control flow characteristics and pattern wettability.

Alternatively, the ceramic slurry which forms the mold material could have the composition disclosed in U.S. Pat. No. 4,947,927 issued Aug. 14, 1990 and entitled "Method of Casting a Reactive Metal Against a Surface Formed From an Improved Slurry Containing Yttria". It is believed that the ceramic slurry disclosed in the aforementioned U.S. Pat. No. 4,947,927 may be particularly advantageous when the article to be cast is formed of a reactive metal, such as titanium or a nickel-chrome superalloy. Of course, other known ceramic slurries could be used if desired.

The wax pattern assembly is repetitively dipped in the ceramic slurry until a coating of wet ceramic mold material has been formed over the pattern assembly having a desired thickness. The wet coating of ceramic mold material completely encloses the portions of the retainer pins 60 which projected from the article pattern. After the wet ceramic mold material has at least partially dried, the mold structure 32 is heated to melt the wax material of the pattern assembly. The melted wax is poured out of the mold structure 32 through the open end of the pour cup 40. Although the mold structure 32 has been shown as having only a single article mold 34 connected with a single pour cup 40, it is contemplated that the mold structure 32 could be constructed in such a manner as to have a plurality of article molds and single crystal selectors 42 connected with a single pour cup 40 by a suitable gating constructed in a known manner.

After the wax pattern material has been removed from the mold structure 32, the mold structure is fired at a temperature of approximately 1,900° F. for a time sufficient to cure the mold structure. During firing of the mold structure 32, the end portions 62 and 64 of the retainer pins 60 are fixedly embedded in the ceramic material of the wall sections 50 and 52 of the mold structure. Thus, the end portions 62 and 64 of the retainer pins 60 were completely enclosed by the wet ceramic slurry of the mold materials during dipping of the pattern assembly. Upon subsequent drying and firing of the ceramic mold material, the end portions 62 and 64 of the retainer pins 60 are embedded in the hardened ceramic mold material of the wall sections 50 and 52 to interlock the retainer pins 60 and the mold structure 32.

The connector portions 70 of the retainer pins 60 extend across the space corresponding to the mold cavity 36 (FIG. 4). Thus, the connector portion 70 of each retainer pin 60 spans a distance corresponding to the thickness of the thin main section 14 of the metal panel 12. For the previously mentioned embodiment of the thin metal panel 12, this distance is approximately 0.015 inches.

The retainer pins 60 retain the mold wall sections 50 and 52 against movement relative to each other during firing of the mold structure 32. During firing of the mold structure 32 the end portions 62 and 64 of the retainer pins transmit force to the connector portions 70 of the retainer pins to prevent relative movement between the mold wall sections. This prevents deformation of the mold wall sections from the pressures developed during firing and removal of the pattern.

Once the mold structure 32 has been formed in the manner previously described, molten metal is poured into the mold structure through the pour cup 40. Although many different metals could be utilized, the molten metal was a nickel-chrome superalloy. The molten metal flows from the pour cup 40 through the article mold cavity 36 into the single crystal selector 42 and starter 44. Molten metal is poured into the pour cup 40 until the starter 44, single crystal selector 42, article mold cavity 36 are completely filled with molten metal and the pour cup is at least partially filled with molten metal. The pouring of the molten metal into the mold structure 32 may advantageously be preformed in an evacuated environment in order to avoid contamination of the molten metal.

As the molten metal enters the article mold cavity 36, the molten metal applies force against the side surfaces 54 and 56 of the wall sections 50 and 52. The pressure applied against the side surfaces 54 and 56 of the wall sections 50 and 52 urges the wall sections away from each other. However, the retainer pins 60 are effective to retain the wall sections 50 and 52 against movement relative to each other under the influence of the force applied against the wall sections by the molten metal.

The force applied against the wall section 50 by the molten metal in the mold cavity 36 presses the ceramic mold material of the wall section against the flat side surface 74 on the end portion 62 of the retainer pin 60. The connector portion 70 of the retainer pin 60 holds the end portions 62 of the retainer pin against movement under the influence of the force applied against the side surface 74 of the end portion 62 by the ceramic mold material of the wall section 50. Therefore, the wall section 50 does not move relative to the wall section 52.

Similarly, the force applied against the wall section 52 by the molten metal in the mold cavity 36 presses the ceramic mold material of the wall section 52 against the flat annular side surface 84 on the end portion 64 of the retainer pin 60. The force applied against the end portion 60 of the retainer pin by the ceramic mold material of the wall section 52 is transmitted to the connector portion 70. The connector portion 70 retains the end portion 64 of the retainer pin 60 and the mold wall section 52 against movement relative to the mold wall section 50.

During pouring of molten metal into the mold cavity 36 and the subsequent solidification of the molten metal in the mold cavity, the end portions 62 and 64 of the retainer pins 60 hold the wall sections 50 and 52 of the mold structure 32 against movement relative to each other. This results in the cast metal panel 12 being accurately formed with the desired dimensions. It should be understood that although the foregoing description has been in conjunction with the casting of a thin metal panel 12 formed of a reactive metal, specifically a nickel-chrome superalloy, retainer pins having a construction similar to the retainer pins 60 could be utilized in many different types of mold structures during the casting of many different types of articles from many different metals. For example, relatively large retainer pins 60 could be spaced relatively large distances apart and used to hold mold wall sections of a mold structure in which a relatively thick article is cast. The relatively thick article could be cast from any desired metal. Of course, the retainer pins would be formed of a material which would not react with the metal from which the article is to be cast and would be capable of withstanding the relatively high temperatures of the molten metal poured into the mold cavity.

In FIG. 4, the end portions 62 and 64 of the retainer pin 60 are illustrated as being embedded in outer wall sections 50 and 52 of a relatively simple mold structure. However, in a more complicated mold structure, the head end portion 62 of the retainer pin 60 could be embedded in a core section and the head end portion 64 embedded in either another core section or a wall section of the mold structure.

Retainer Pin—Second Embodiment

In the embodiment of the invention illustrated in FIGS. 1–5, the retainer pins 60 have relatively large end portions 62 and 64. The use of the relatively large end portions 62 and 64 facilitates forming a mechanical interlock between the retainer pins and the wall sections 50 and 52. However, the use of the relatively large end portions 62 and 64 requires the formation of a relatively large opening or hole in the wax pattern of the article to be cast so that a retainer pin 60 can be inserted through the wax pattern with the end portions projecting from opposite sides of the pattern. The relatively large holes in the wax pattern are sealed against the relatively small diameter connector portions 70 of the retainer pins 60.

Figure 6:
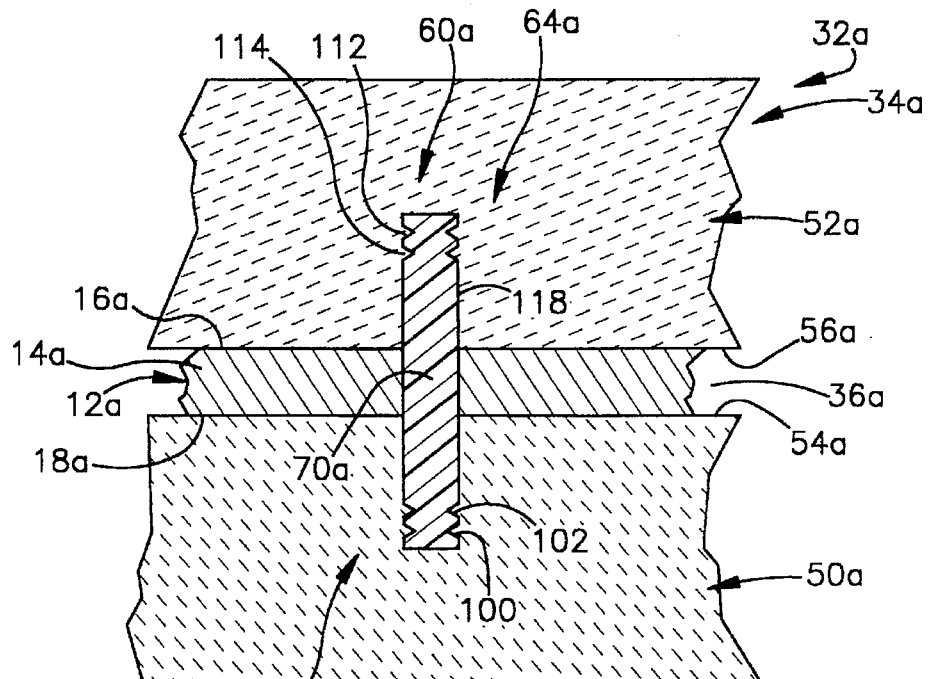
FIG. 6 is a fragmentary sectional view, generally similar to FIG. 4, illustrating the relationship between a second embodiment of the pin and wall sections of the mold structure of FIG. 3.
Figure 7:
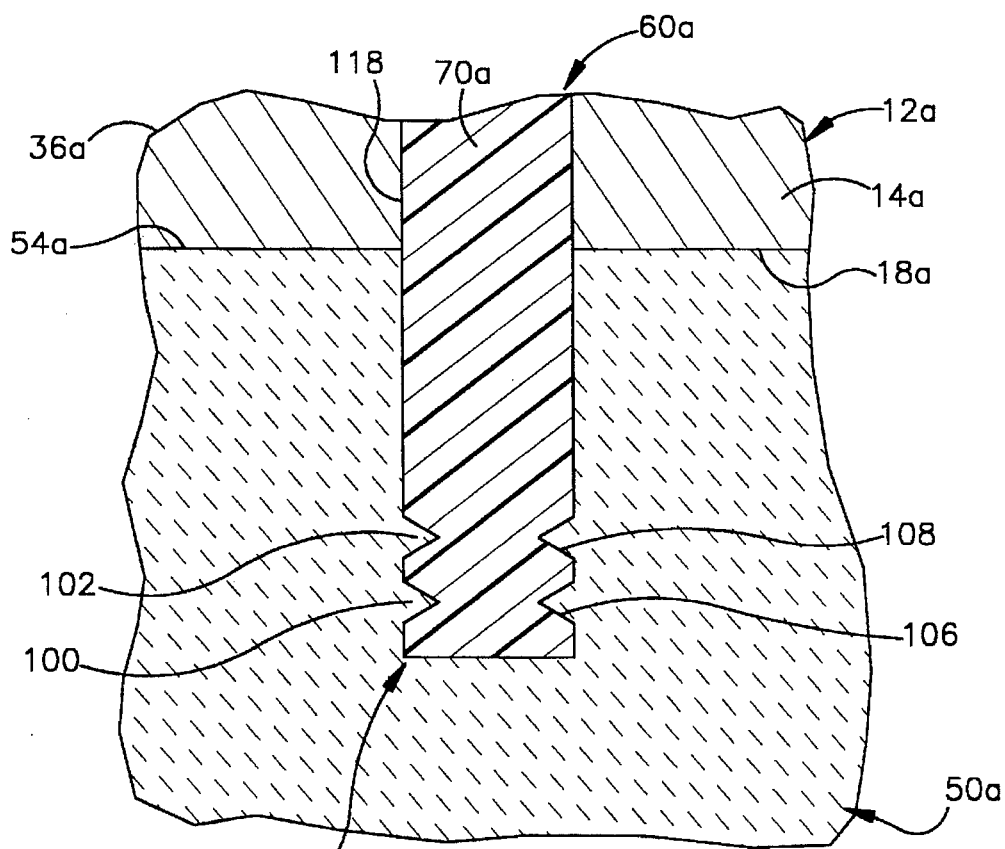
FIG. 7 is a further enlarged fragmentary sectional view illustrating the relationship between one end portion of the pin of FIG. 6 and a wall section of the mold structure.

In the embodiment of the invention illustrated in FIGS. 6 and 7, the end portions of the retainer pins are of the same size as the connector portion of the retainer pins. The surfaces which face toward the mold cavity to interlock the retainer pins and the mold sections are located in recesses in the retainer pins. Therefore, it is not necessary to seal openings around the central portions of the retainer pins. Since the embodiment of the invention illustrated in FIGS. 6 and 7 is generally similar to the embodiment of the invention illustrated in FIGS. 1–5, similar numerals will be used to designate similar components, the suffix letter "a" being associated with the numerals of FIGS. 6 and 7 to avoid confusion.

A mold structure 32a (FIG. 6) has the same construction as the mold structure 32 of FIG. 3. Thus, the mold structure 32a (FIG. 6) includes an article mold 34a. The article mold 34a has an article mold cavity 36a disposed between wall sections 50a and 52a of the article mold. The wall sections 50a and 52a have flat parallel inner side surfaces 54a and 56a which cooperate to at least partially define the article mold cavity 36a.

Although the article mold cavity 36a could have a configuration corresponding to the configuration of many different articles, in the specific embodiment of the invention illustrated in FIGS. 6 and 7, the article mold cavity 36a has a configuration corresponding to the configuration of a thin metal panel 12a. The thin metal panel 12a has a main section 14a with flat parallel opposite side surfaces 16a and 18a. The main section 14a of the thin metal panel 12a has a thickness of less than 0.050 inches. In one specific embodiment of the invention, the main section 14a of the thin metal panel 12a had a thickness of 0.015 inches, as measured perpendicular to and between the side surfaces 16a and 18a of the main section 14a of the thin metal panel 12a.

A plurality of retainer pins 60a extend between and interconnects the wall sections 50a and 52a. Each of the retainer pins 60a has opposite end portions 62a and 64a. The end portions 62a and 64a of the retainer pin 60a are interconnected by a connector portion 70a. The connector portion 70a extends across or spans the mold cavity 36a.

The retainer pin 60a has a longitudinal central axis which extends through opposite end portions 62a and 64a of the pin and extends perpendicular to the side surfaces 54a and 56a of the wall sections 50a and 52a. The central axis of the pin 60a could be skewed at an acute angle to the side surfaces 54a and 56a of the wall sections 50a and 52a. Adjacent retainer pins 60a could be positioned in different orientations relative to the side surfaces 54a and 56a of the wall sections 50a and 52a if desired.

In accordance with a feature of this embodiment of the invention, the retainer pin end portion 62a has a plurality of annular grooves or recesses 100 and 102. The groove 100 has a flat annular side surface 106 (FIG. 7) which faces toward the article mold cavity 36a and which is engaged by the ceramic mold material of the wall section 50a. Similarly, the groove 102 has a flat annular side surface 108 which faces toward the article mold cavity 36a and engages the ceramic mold material of the wall section 50a. The annular grooves 100 and 102 in the end portion 62a of the retainer pin 60a are completely filled with the ceramic mold material of the wall section 50a. The ceramic mold material received in the annular grooves 100 and 102 interlocks the end portion 62a of the retainer pin 60a and the wall section 50a to hold the retainer pin against movement relative to the wall section.

The opposite end portion 64a (FIG. 6) of the retainer pin 60a also has a pair of annular grooves or recesses 112 and 114. The grooves 112 and 114 in the end portion 64a of the retainer pin 60a have the same configuration as the grooves or recesses 100 and 102 in the end portion 62a. The grooves 112 and 114 in the end portion 64a of the retainer pin 60a are completely filled with the ceramic mold material of the wall section 52a. Therefore, the end portion 64a and the wall section 52a are mechanically interlocked to prevent relative movement between the retainer pin 60a and the wall section.

The grooves 100, 102, 112 and 114 (FIG. 6) in the retainer pin 60a extend inwardly from a cylindrical outer side surface 118 on the retainer pin 60a. Therefore, the end portions 62a and 64a of the retainer pin 60a have the same maximum size as the connector portion 70a of the retainer pin. This enables the retainer pin 60a to be inserted through a relatively small opening in a wax pattern. The small opening in the wax pattern would have the same diameter as the cylindrical outer side surface 118 of the retainer pin 60a.

In the illustrated embodiment of the invention, the retainer pins 60a are all positioned with their central axes extending perpendicular to flat outer side surfaces of the wax pattern. However, the retainer pins 60a could be oriented with their central axes skewed at acute angles to flat outer side surfaces of the pattern. The retainer pins 60a could be positioned with their central axes in different orientations relative to the flat outer side surfaces of the wax pattern.

When molten metal is conducted into the mold cavity 36a, the molten metal applies force against the side surfaces 54a and 56a of the wall sections 50a and 52a. This force urges the wall sections 50a and 52a away from each other. The retainer pins 60a have end portions 62a and 64a which are mechanically interlocked with the ceramic mold material of the wall sections 50a and 52a to transmit force between the wall sections and retain them against movement relative to each other.

The annular side surface 106 of the groove 100 in the end portion 62a (FIG. 7) of the retainer pin 60a is pressed against the ceramic mold material filling the groove 100a. Similarly, the annular side surface 108 of the groove or recess 102 is pressed against the ceramic mold material filling the groove 102. This results in a reaction force being transmitted to the connector portion 70a of the retainer pin 60a. This reaction force is offset by the equal and opposite reaction force from the end portion 64a of the retainer pin.

Although only a single retainer pin 60a is illustrated in FIGS. 6 and 7, a plurality of retainer pins are utilized with the mold structure 32a. Although the grooves 100, 102, 112 and 114 have a V-shaped radial cross sectional configuration, the grooves could be provided with a different configuration if desired. For example, a single spiral groove having a rectangular radial cross sectional configuration could be utilized if desired.

Retainer Pin—Third Embodiment

Figure 8:
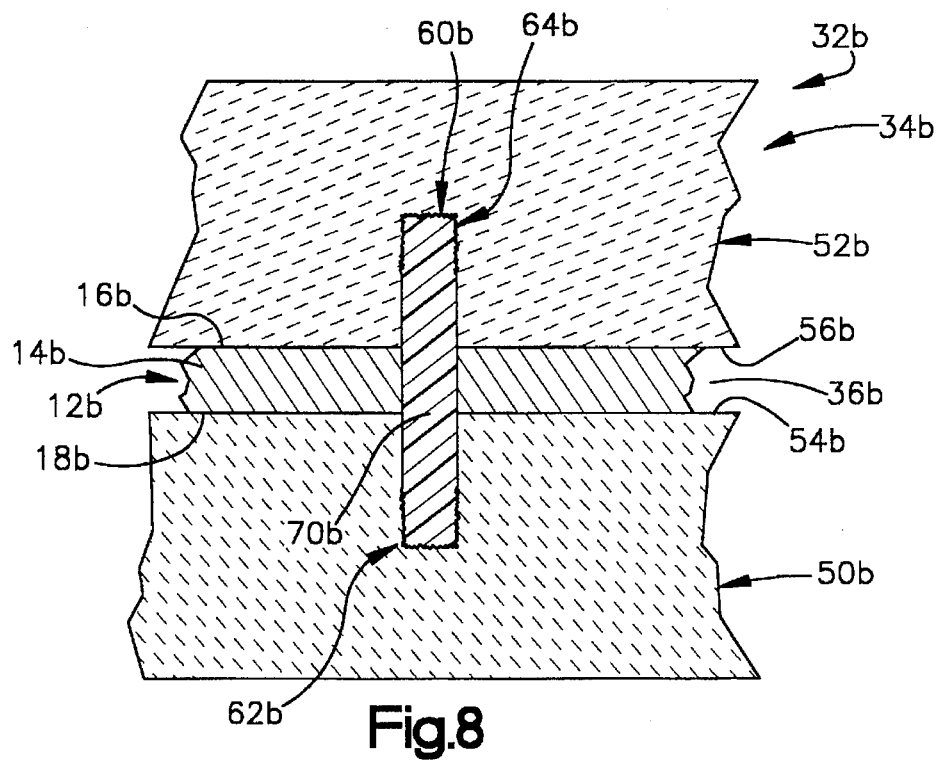
FIG. 8 is a fragmentary sectional view, generally similar to FIGS. 4 and 6, illustrating the relationship of a third embodiment of the pin to wall sections of the mold structure of FIG. 3.
Figure 9:
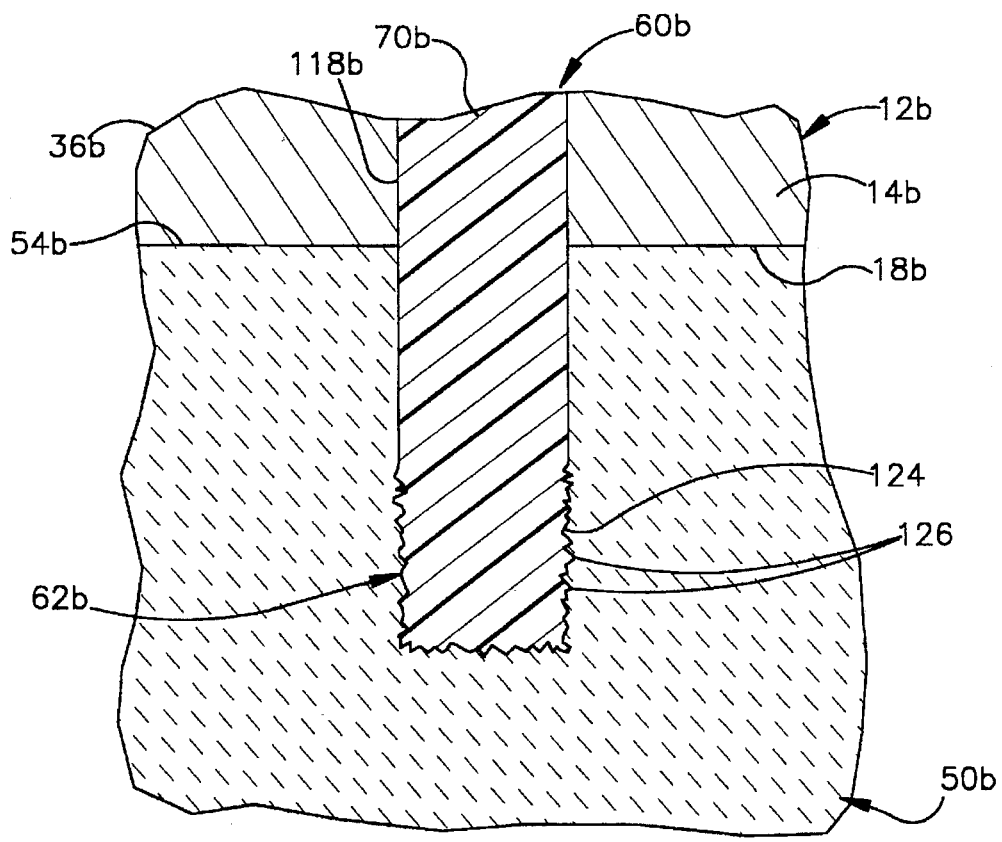
FIG. 9 is a further enlarged fragmentary sectional view illustrating the relationship of an end portion of the pin of FIG. 8 and a wall section of the mold structure.

In the embodiments of the retainer pins 60 and 60a illustrated in FIGS. 4–7, outwardly extending or inwardly extending side surfaces on the end portions of the retainer pins engage the ceramic mold material of the wall sections to hold the wall sections against movement relative to each other. In the embodiment of the invention illustrated in FIGS. 8 and 9, the end portions of the retainer pins are roughened to have an irregular surface which is mechanically interlocked with the ceramic material of the wall sections of the mold. Since the embodiment of the invention illustrated in FIGS. 8 and 9 is generally similar to the embodiment of the invention illustrated in FIGS. 1–7, similar numerals will be utilized to designate similar components, the suffix letter "b" being associated with the numerals of FIGS. 8 and 9 to avoid confusion.

A mold structure 32b (FIG. 8) includes an article mold 34b. The article mold 34b has tan article mold cavity 36b which is disposed between wall sections 50b and 50b of the mold structure 32b. The wall sections 50b and 50b have inner side surfaces 54b and 56b which at least partially define the article mold cavity 36b. A thin metal panel 12b is cast in the article mold cavity 36b. The thin panel 12b includes a main section 14b having side surfaces 16b and 18b which engage the side surfaces 54b and 56b of the article mold cavity 36b.

A plurality of retainer pins 60b interconnect the wall sections 50b and 50b and hold the wall sections against movement relative to each other. The retainer pin 60b includes an end portion 62b which is mechanically interlocked with the wall section 50b and an end portion 64b which is mechanically interlocked with the wall section 52b. A connector portion 70b extends between the end portions 62b and 64b of the connector pin 60b. The end portions 62b and 64b have a generally cylindrical configuration with a diameter which is slightly smaller than the diameter of the connector portion 70b. Therefore, the retainer pin 60b can be inserted through a circular opening in a wax pattern if the opening is large enough to receive the connector portion 70b of the retainer pin.

The retainer pin 60b has a longitudinal central axis which extends through opposite end portions 62b and 64b of the pin and extends perpendicular to the side surfaces 54b and 56b the wall sections 50b and 50b. The central axis of the pin 60b could be skewed at an acute angle to the side surfaces 54b and 56b of the wall sections 50b and 50b. Adjacent retainer pins 60b could be positioned in different orientations relative to the side surfaces 54b and 56b of the wall sections 50b and 50b if desired.

In accordance with a feature of this embodiment of the invention, the end portions 62b of the retainer pin 60b is formed with an irregular outer side surface. As originally formed, the retainer pin 60b had a smooth cylindrical outer side surface 118b which extended between opposite ends of the retainer pin 60b. The end portion 62b (FIG. 9) was formed with an irregular surface by roughening the smooth outer side surface 118b the end portion 62b of the retainer pin 60b.

The end portion 62b of the retainer pin 60b was sand blasted to form irregular recesses 124 and irregular projections 126 on the end portion 62b of the retainer pin 60b. Since the smooth outer side surface 118b as sand blasted to form the recesses 124 and projections 126, the projections do not extend outward of the smooth outer side surfaces 118b the retainer pin 60b. Therefore, the retainer pin can be inserted through an opening in a wax pattern having a diameter which is only slightly greater than the diameter of the cylindrical outer side surface 118b the retainer pins 60b.

The projections 126 on the axially extending side of the retainer pins 60b have surfaces which face toward the article mold cavity 36b. Although the projections 126 are irregular about the end portion 62b, each of the projections has an outer side surface which faces toward the article mold cavity 36b. Since the ceramic mold material of the wall section 50b fills recesses 124 and completely encloses the projections 126, there is a mechanical interlock between the end portion 62b of the retainer pin 60b and the wall section 50b.

Although only the end portion 62b of the retainer pin 60b is illustrated in FIG. 9, it should be understood that the end portion 64b (FIG. 8) of the retainer pin 60b has been roughened in the same manner as in which the end portion 62b of the retainer pin has been roughened. Therefore, there are irregular recesses and projections on the end portion 64b of the retainer pin 60b. The recesses are completely filled with the ceramic mold material of the wall sections 50b. The projections have side surfaces which face toward the article mold cavity 36b.

In the illustrated embodiment of the invention, the retainer pins 60b are all positioned with their central axes extending perpendicular to flat outer side surfaces of the wax pattern. However, the retainer pins 60b could be oriented with their central axes skewed at acute angles to flat outer side surfaces of the pattern. The retainer pins 60b could be positioned with their central axes in different orientations to the flat outer side surfaces of the wax pattern.

When molten metal is conducted into the article mold chamber 36b, the molten metal applies force against the side surfaces 54b and 56b of the article mold 34b. This force tends to separate the wall sections 50b and 50b. However, the mechanical interlock between the end portions 62b and 64b of the retainer pin 60b resists relative movement between the wall sections 50b and 50b so that the wall sections do not move relative to each other. Thus, when molten metal is poured into the article mold cavity 36b, the ceramic mold material of the wall sections 50b and 52b is pressed against the side surfaces of the projections 126 on the end portions 62b and 64b of the retainer pin 60b to hold the wall sections 50b and 50b against movement relative to each other.

Retainer Pin—Fourth Embodiment

Figure 10:
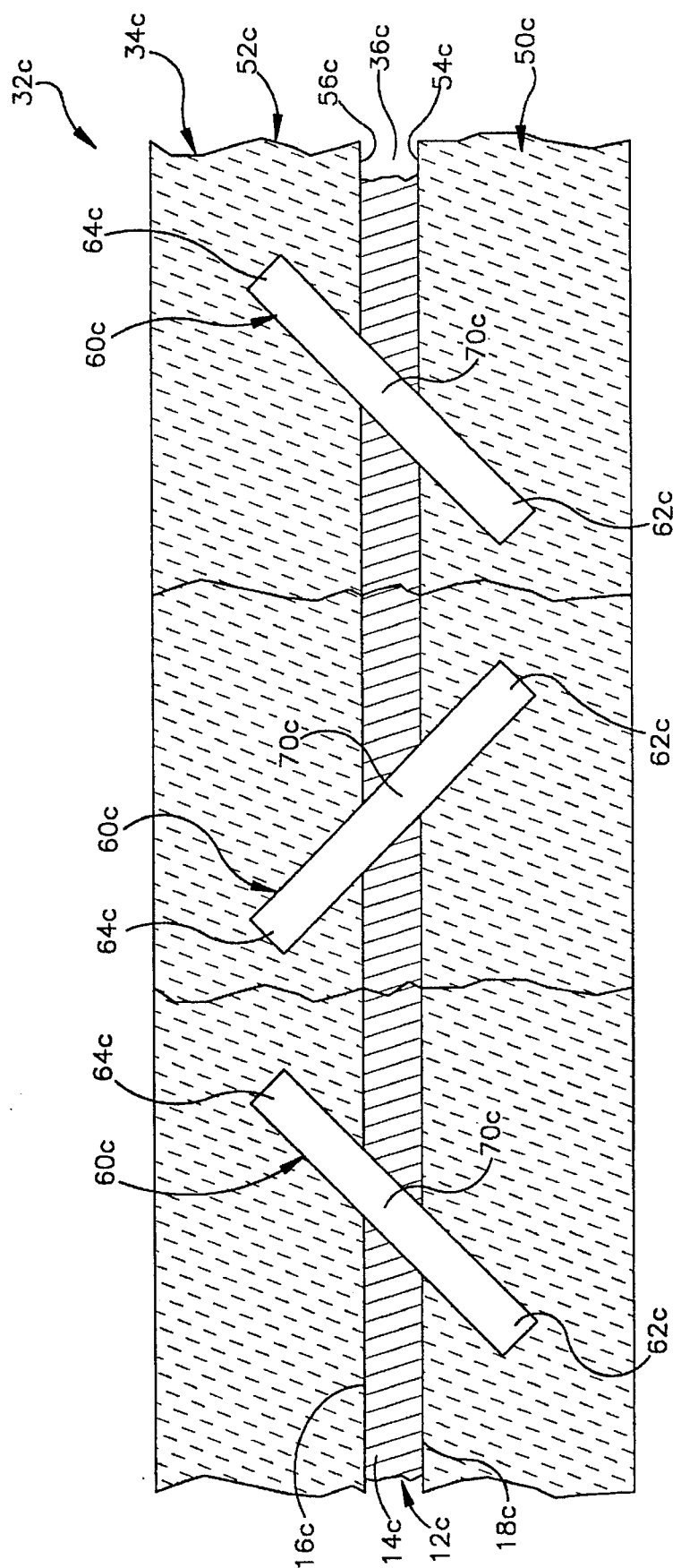
FIG. 10 is a fragmentary sectional view, generally similar to FIGS. 4, 6 and 8, illustrating the relationship of a fourth embodiment of the pin to wall sections of the mold structure of FIG. 3.

In the embodiments of the retainer pins 60, 60a and 60b illustrated in FIGS. 4–9, side surfaces on the end portions of the retainer pins engage the ceramic mold material of the wall sections to hold the wall sections against movement relative to each other. In the embodiment of the invention illustrated in FIG. 10, the end portions of the retainer pins have a smooth cylindrical configuration which is a continuation of the smooth cylindrical configuration of the central portions of the retainer pins. The retainer pins of the embodiment of the invention illustrated in FIG. 10 are mechanically interlocked with the ceramic material of the wall sections of the mold by having the retainer pins skewed at acute angles relative to flat side surfaces on the wall sections. Since the embodiment of the invention illustrated in FIG. 10 is generally similar to the embodiment of the invention illustrated in FIGS. 1–9, similar numerals will be utilized to designate similar components, the suffix letter "c" being associated with the numerals of FIG. 10 to avoid confusion.

A mold structure 32c (FIG. 10) includes an article mold 34c. The article mold 34c has an article mold cavity 36c which is disposed between wall sections 50c and 52c of the mold structure 32c. The wall sections 50c and 52c have inner side surfaces 54c and 56c which at least partially define the article mold cavity 36c. A thin metal panel 12c is cast in the article mold cavity 36c. The thin metal panel 12c includes a main section 14c having side surfaces 16c and 18c which engage side surfaces 54c and 56c of the article mold cavity 36c.

A plurality of identical retainer pins 60c interconnect the wall sections 50c and 52c to hold the wall sections against movement relative to each other. The retainer pins 60c cooperate with each other to form a mechanical interlock with the wall sections 50c and 52c. A connector portion 70c extends between end portions 62c and 64c of each of the connector pins 60c. The end portions 62c and 64c of the connector pins 60c have a cylindrical configuration with a smooth outer side surface. Therefore, the retainer pins 60c can be inserted through a circular opening in a wax pattern if the opening is large enough to receive the connector portion 70c of the retainer pin.

In accordance with a feature of this embodiment of the invention, the retainer pins 60c have longitudinal central axes which extend through opposite end portions 62c and 64c of the retainer pins and are skewed at an acute angle relative to the side surfaces 54c and 56c of the wall sections 50c and 52c. The adjacent retainer pins 60c are positioned in different orientations relative to the side surfaces 54c and 56c of the wall sections 50c and 52c.

In the embodiment of the invention illustrated in FIG. 10, the relationship between three adjacent connector pins 60c and the mold structure 32c is illustrated. The central connector pin 60c has a longitudinal central axis which extends transverse to the longitudinal central axes of the pins 60c disposed at the left and right end portions of FIG. 10. In the illustrated embodiment of the invention, the retainer pins 60c all have central axes which are skewed at an acute angle of approximately 45° relative to the side surfaces 54c and 56c of the Wall sections 50c and 52c of the mold structure 32c. However, the retainer pins 60c could, if desired, have longitudinal central axes which are skewed at different angles relative to the side surfaces 54c and 56c of the mold structure 32c. For example, the left (as viewed in FIG. 10) pin 60c could have a central axis which is skewed at an angle of 60° to the side surfaces 54c and 56c of the mold wall sections 50c and 52c while the right pin 60c could have a central axis which is skewed at angle of 30° to the side surfaces 54c and 56c of the mold wall sections 50c and 52c.

The adjacent connector pins 60c are disposed in different orientations relative to each other. It is contemplated that the connector pins will be randomly oriented in different orientations relative to each other so that the adjacent connector pins do not have the same orientation relative to the side surfaces 54c and 56c of the mold wall sections 50c and 52c. By randomly orienting the retainer pins 60c relative to each other and to the side surfaces 54c and 56c of the mold wall sections 50c and 52c, the pins interlock with the mold wall sections with a wedging-type action so that force is transmitted between the smooth cylindrical outer side surfaces of the retainer pin 60c and the mold wall sections 50c and 52c have different lines of action. The resulting meshing engagement of the plurality of retainer pins 60c with the wall sections 50c and 52c holds the wall sections against movement relative to each other.

When molten metal is conducted into the article mold chamber 36c, the molten metal applies force against the side surfaces 54c and 56c of the article mold 34c. This force tends to separate the mold wall sections 50c and 52c. However, the mechanical interlock provided by having the retainer pins 60c in different orientations relative to the mold wall sections 50c and 52c resists relative movement between the mold wall sections. Thus, when molten metal is poured into the article mold cavity 36c, the ceramic mold material of the wall sections 50c and 52c is pressed in different directions against the smooth cylindrical outer side surfaces of the retainer pins 60c. This results in the mold wall sections 50c and 52c being held against movement relative to each other.

Although the retainer pins 60c have been illustrated in FIG. 10 as having a smooth cylindrical outer side surface, it is contemplated that the retainer pins could be constructed in the manner illustrated in FIGS. 4–9. Thus, the retainer pins could be provided with end portions 62c and 64c which project outward from the cylindrical connector portion 70c of the retainer pin in the same manner as is illustrated in FIG. 4. Alternatively, the end portions 62c and 64c could be provided with a plurality of annular grooves or recesses in the same manner as disclosed in FIG. 7. Another alternative embodiment of the retainer pins 60c could have roughened end portions 62c and 64c and was described in connection with the embodiment of the invention illustrated in FIG. 8. By positioning the retainer pins having any one of these alternative constructions in different orientations relative to the mold structure, in the manner illustrated in FIG. 10 for the retainer pin 60c, the orientation of the longitudinal central axes of the retainer pins results in an intermeshing type interlock between the retainer pins and the mold wall sections.

CONCLUSION

The present invention provides a new improved method and apparatus for use in casting a metal article. The apparatus includes a mold structure 32 having one or more pins 60 which extend between wall sections 50 and 52 of the mold structure. A first end portion 62 of a pin 60 is disposed in the first wall section 50 of the mold structure 32 and a second end portion 64 of the pin is disposed in a second wall section 52 of the mold structure. A third or connector portion 70 of the pin 60 is disposed in the mold cavity 36. The end portions 62 and 64 of the pin 60 and the wall sections 50 and 52 of the mold structure 32 are interlocked to prevent relative movement between the wall sections.

To interlock the end portions of a pin 60 and a wall section 50 of the mold structure, in the embodiment of the invention illustrated in FIGS. 4–9, the pin has a surface 74 which faces toward the mold cavity 30 and transmits force to the wall section of the mold structure. The end portion 62 of the pin 60 may have an outwardly flaring head end section (FIG. 4), a circular groove (FIG. 6), and/or a roughened portion (FIG. 8) which provides an interlock with the ceramic material of the wall section of the mold.

In the embodiment of the invention illustrated in FIG. 10, the pins 60c have central axes which are disposed in different orientations relative to wall sections 50c and 52c of the mold. These pins 60c are effective to apply forces in different directions relative to the mold structure.

Although the method and apparatus of the present invention may be utilized to cast many different types of objects, it is believed that the method and apparatus will be particularly advantageous in casting relatively long, and/or wide metal objects which are very thin. Thus, the method and apparatus may be used to cast a metal object 12 having a thickness of 0.050 or less and a length and width of four inches or more. Although the thin metal article 12 could be formed of many different metals having any one of many different crystallographic structures, the method and apparatus may advantageously be used to form a single crystal metal article, such as a plate or airfoil.

Having described the invention, the following is claimed:

1. An apparatus for use in casting a metal article, said apparatus comprising a ceramic mold structure having first and second sections with a mold cavity which receives molten metal disposed between the first and second sections of said mold structure, and a pin having a first end portion disposed in the first section of said mold structure, a second end portion disposed in the second section of said mold structure, and a third portion which is disposed in the mold cavity and is disposed between the first and second end portions of said pin, first interlock means for interconnecting the first end portion of said pin and the first section of said mold structure, said first interlock means including a first surface disposed on the first end portion of said pin and facing toward the mold cavity, said first surface of said first interlock means being disposed in engagement with material of the first section of said mold structure, and second interlock means for interconnecting the second end portion of said pin and the second section of said mold structure, said second interlock means including a second surface disposed on the second end portion of the pin and facing toward the mold cavity, said second surface of said second interlock means being disposed in engagement with material of the second section of said mold structure.

2. An apparatus as set forth in claim 1 wherein said pin has a longitudinal central axis which extends through said first and second end portions of said pin, said mold cavity having a thickness measured along the central axis of said pin of 0.050 inches or less.

3. An apparatus as set forth in claim 1 wherein said third portion of said pin has a smooth outer side surface which is free of discontinuities.

4. An apparatus as set forth in claim 1 wherein said pin has a longitudinal central axis which extends through said first and second end portions of said pin, said first end portion of said pin having a first cross sectional area in a plane perpendicular to the longitudinal central axis of said pin, said third portion of said pin having a cross sectional area in a plane perpendicular to the longitudinal central axis of said pin which is smaller than said first cross sectional area.

5. An apparatus as set forth in claim 4 wherein said first cross sectional area has a circular configuration, said third portion of said pin having a circular cross sectional area with a diameter which is less than a diameter of said first cross sectional area.

6. An apparatus as set forth in claim 4 wherein said second end portion of said pin has a cross sectional area in a plane perpendicular to the longitudinal central axis of said pin which is larger than the cross sectional area of said third portion of said pin in a plane perpendicular to the longitudinal central axis of said pin.

7. An apparatus as set forth in claim 1 wherein said pin has a longitudinal central axis which extends through said first and second end portions of said pin, at least a portion of said first end portion of said pin having a first cross sectional area in a plane perpendicular to the longitudinal central axis of said pin, said third portion of said pin having a cross sectional area in a plane perpendicular to the longitudinal central axis of said pin which is larger than said first cross sectional area.

8. An apparatus as set forth in claim 7 wherein said first cross sectional area has a circular configuration, said third portion of said pin having a circular cross sectional area with a diameter which is greater than a diameter of said first cross sectional area.

9. An apparatus as set forth in claim 7 wherein at least a portion of said second end portion of said pin has a cross sectional area in a plane extending perpendicular to the longitudinal central axis of said pin which is smaller than the cross sectional area of said third portion of said pin in a plane perpendicular to the longitudinal central axis of said pin.

10. An apparatus as set forth in claim 1 wherein said first end portion of said pin forms a head end portion of said pin, said third portion of said pin at least partially forms a shank portion of said pin which extends axially outward from said head end portion of said pin, said first surface being disposed on a side of said head end portion of said pin toward said shank portion of said pin.

11. An apparatus as set forth in claim 1 wherein said first end portion of said pin includes a recess, said first surface being disposed on a side of said recess.

12. An apparatus as set forth in claim 1 wherein said first and second end portions of said pin have been at least partially roughened, said first surface being disposed on a roughened portion of said first end portion of said pin, said second surface being disposed on a roughened portion of said second end portion of said pin.

13. An apparatus as set forth in claim 1 wherein said first end portion of said pin includes a circular groove which extends around said first end portion of said pin, said first surface being disposed on a side of said groove, said groove being filled with the material of the first section of said mold structure.

14. An apparatus as set forth in claim 13 wherein said second end portion of said pin includes a second circular groove which extends around said second end portion of said pin, said second surface being disposed on a side of said second groove, said second groove being filled with the material of said second section of said mold structure.

15. An apparatus as set forth in claim 1 wherein said first end portion of said pin is embedded in and completely enclosed by said first section of said mold structure, said second end portion of said pin being embedded in and completely enclosed by said second section of said mold structure.

16. An apparatus as set forth in claim 1 wherein said first section of said mold structure has a first side surface area, said second section of said mold structure has a second side surface area which extends parallel to said first side surface area, said first and second side surface areas cooperating to at least partially define said mold cavity, said pin having a longitudinal central axis which extends through said first and second end portions of said pin and is skewed at an acute angle to said first and second side surface areas.

17. A method of casting a metal article, said method comprising the steps of providing a pattern having a plurality of pins extending through the pattern with first end portions of the pins projecting from a first side of the pattern and second end portions of the pins projecting from a second side of the pattern, covering the pattern and the first and second end portions of the pins with wet ceramic material, drying the wet ceramic material to at least partially form a mold structure having a first section in which the first end portions of the pins are embedded and a second section in which the second end portions of the pins are embedded, removing the pattern from the mold structure to leave a mold cavity with the pins extending through the mold cavity between the first and second sections of the mold structure, conducting molten metal into the mold cavity, urging the first and second sections of the mold structure away from each other under the influence of force applied against the first and second sections of the mold structure by the molten metal in the mold cavity, and retaining the first and second sections of the mold structure against movement relative to each other by transmitting force from the first end portions of the pins to the first section of the mold structure opposing movement of the first section of the mold structure away from the second section of the mold structure and by transmitting force from the second end portions of the pins to the second section of the mold structure opposing movement of the second section of the mold structure away from the first section of the mold structure, said step of transmitting force from the first end portions of the pins to the first section of the mold structure includes pressing surfaces disposed on the first end portions of the pins and facing toward the mold cavity against ceramic material in the first section of the mold structure and said step of transmitting force from the second end portions of the pins to the second section of the mold structure includes pressing surfaces disposed on the second end portions of the pins and facing toward the mold cavity against ceramic material in the second section of the mold structure.

18. A method as set forth in claim 17 wherein said step of drying the wet ceramic material to at least partially form a mold structure having a first section in which first end portions of the pins are embedded and a second section in which second end portions of the pins are embedded includes mechanically interlocking the first end portions of the pins and the first section of the mold structure against axial movement of the pins relative to the first section of the mold structure and mechanically interlocking the second end portions of the pins and the second section of mold structure against axial movement of the pins relative to the second section of the mold structure.

19. A method as set forth in claim 17 wherein said step of covering the pattern and the first and second end portions of the pins with wet ceramic material includes filling recesses in the first and second end portions of the pins with wet ceramic material, said step of drying the wet ceramic material includes drying the wet ceramic material in the recesses in the first and second end portions of the pins.

20. A method as set forth in claim 17 wherein said step of providing a pattern having a plurality of pins extending through the pattern includes providing a pattern in which a first one of the pins has a longitudinal central axis which is disposed in a first orientation relative to the first side of the pattern and a second one of the pins has a longitudinal axis which is disposed in a second orientation relative to the first side of the pattern, said step of retaining the first and second sections of the mold structure against movement relative to each other includes transmitting force in a first direction from the first end portion of the first pin to the first section of the mold structure and transmitting force in a second direction from the first end portion of the second pin to the first section of the mold structure, said first direction being different than said second direction.

21. A mold as set forth in claim 17 wherein said step of providing a pattern having a plurality of pins extending through the pattern includes providing a pattern having a flat outer side surface area and positioning a plurality of pins relative to the flat outer side surface area of the pattern with a longitudinal central axis of a first one of the plurality of pins in a first orientation relative to the flat outer side surface area of the pattern and a longitudinal central axis of a second one of the plurality of pins in a second orientation relative to the first outer side surface area of the pattern, said first orientation being different than said second orientation.

22. A method as set forth in claim 17 wherein said step of retaining the first and second sections of the mold structure against movement relative to each other by transmitting force from the first end portions of the pins to the first section of the mold structure includes transmitting force having a first direction from a longitudinally extending side surface area of the first one of the plurality of pins to first the section of the mold structure and transmitting force having a second direction from a longitudinally extending side surface area of the second one of the plurality of pins to the first section of the mold structure, said first direction being transverse to the second direction.

23. A method of casting a metal article, said method comprising the steps of providing a pattern having a plurality of pins extending through the pattern with first end portions of the pins projecting from a first side of the pattern and second end portions of the pins projecting from a second side of the pattern, at least partially covering the pattern and the pins with wet ceramic material, drying the wet ceramic material to at least partially form a mold structure having first and second sections, removing the pattern from the mold structure to leave a mold cavity with the pins extending through the mold cavity between the first and second sections of the mold structure, conducting molten metal into the mold cavity, urging the first and second sections of the mold structure away from each other under the influence of force applied against the first and second sections of the mold structure by the molten metal in the mold cavity, and retaining the first and second sections of the mold structure against movement relative to each other by transmitting force from the first end portions of the pins to the first section of the mold structure opposing movement of the first section of the mold structure away from the second section of the mold structure and by transmitting force from the second end portions of the pins to the second section of the mold structure opposing movement of the second section of the mold structure away from the first section of the mold structure, said step of transmitting force from the first end portions of the pins to the first section of the mold structure includes pressing surfaces disposed on the first end portions of the pins and facing toward the mold cavity against ceramic material of the first section of the mold structure and said step of transmitting force from the second end portions of the pins to the second section of the mold structure includes pressing surfaces disposed on the second end portions of the pins and facing toward the mold cavity against ceramic material of the second section of the mold structure.

* * * * *